Feb. 26, 1963 J. J. WERTH 3,079,568
BROAD BAND AMPLIFIER
Filed Feb. 9, 1959
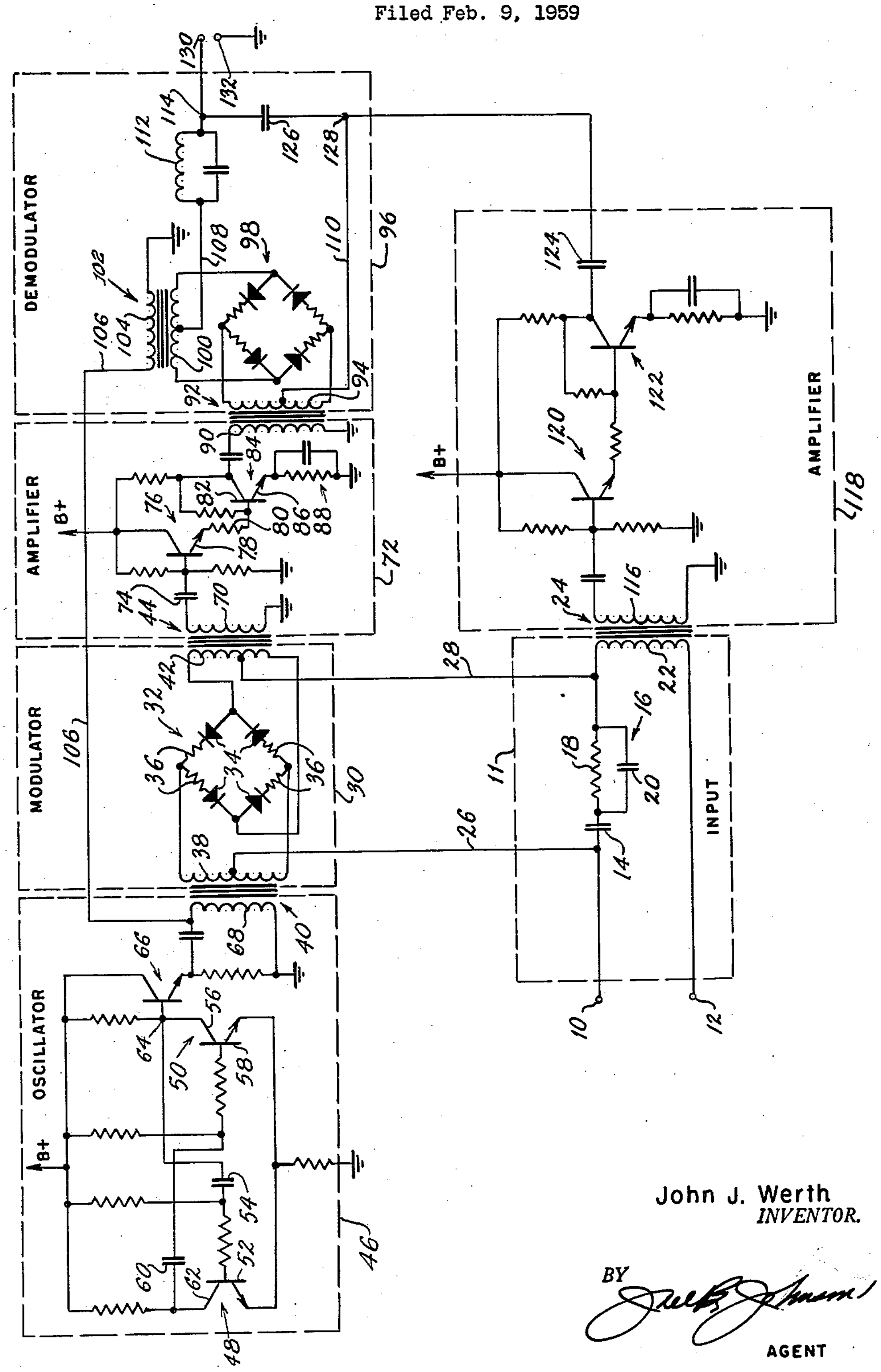
John J. Werth
*INVENTOR.*
BY [signature]
AGENT United States Patent Office 3,079,568

Patented Feb. 26, 1963

3,079,568
BROAD BAND AMPLIFIER

John J. Werth, Paramus, N.J., assignor to ACF Industries, Incorporated, New York, N.Y., a corporation of New Jersey Filed Feb. 9, 1959, Ser. No. 791,936
2 Claims. (Cl. 330—126)

This invention relates to wide band amplifiers, which will linearly amplify frequency components ranging from D.C. to several kilocycles per second.

In certain applications, it is necessary to provide an amplification of electrical signals spread from D.C. over a large range of frequencies, with an accuracy, which will minimize any change in the amplification due to drift. It is necessary that such an amplifier be simple, reliable and accurate. Amplifiers of this type have previously been designed, which divide the incoming signal into low and high frequency components. Each component of the signal is separately amplified and then combined to provide an amplified composite signal of the original input. Difficulties have been experienced with amplifiers of this type because of variations in the electrical components making up different portions of the amplifier. Thus, if instability of certain components occurs in one portion of the system, a distortion of the phase and frequency of the signal frequently occurs, when the amplified components of the signal are combined at the output. Such instability of circuit components provides signal drift, which may be due, for example, to variations in ambient temperature, aging of the circuit component, as well as variations in voltage supplies.

In broad band amplifiers which divide the input signal into two components, there is normally an intermediate spread of the signal frequency range, which is fed into both portions of the amplifying circuit. This intermediate frequency spread range is thus overlapping and provides a problem of linear amplification since if one portion of the system does not accurately amplify the overlapping frequencies fed to it, then the summation of the overlapping portions at the output is not linear with the input signal.

Accordingly, it is an object of the invention to provide a broad band amplifier which is linear for signals ranging from D.C. to A.C. frequency.

It is another object of the invention to provide a broad band amplifier in which drift and mismatch problems occurring during amplification of the signal are minimized.

It is another object of the invention to provide a device for amplifying high and low level input signals without introducing inherent drift errors.

The invention is one which provides a reliable and accurate method of amplifying low and high level input signals in the frequency range of D.C. to 15,000 cycles and above. Means are provided for dividing an incoming signal into high and low frequency components. The high frequency components are fed to an A.C. amplifier, while the low frequency components are modulated, amplified, and demodulated before addition to the amplified high frequency portion to provide the output signal. In accordance with the invention, the means for dividing the incoming signal consists of high and low pass band filters connected in series, whereby change in signal voltages due to variations in the operating characteristics of circuit components are automatically compensated.

The FIGURE discloses a circuit diagram of the broad band amplifier, in accordance with the invention.

The schematic diagram shown in the figure is one which is adapted for the amplification of a band of signals ranging from 0 to 15,000 cycles. The incoming input signal is applied across the input terminals 10 and 12, which may be at high potential above ground or one of which may be grounded. Connected across the terminals 10 and 12, in accordance with the invention, is a series circuit 11, including a capacitor 14 connected between terminal 10 and one end of a filter circuit 16, consisting of a resistor 18, and a capacitor 20 connected in parallel. Connected directly to the other end of filter circuit 16 is a primary coil 22 of a coupling transformer 24. The other end of coil 22 is connected, as shown, to terminal 12.

In an operable form of the invention, the capacitor 14 is one having a value of 10 microfarads, while capacitor 20 has a value of 0.1 microfarad. The resistor 18 has an impedance of 5,000 ohms. This portion of the circuit, consisting of capacitor 14 and the filter circuit 16, is one which blocks the D.C. and low frequency portion of the input signal up to 1,000 cycles per second resulting in a high impedance voltage drop across filter network 16 for these frequencies. The high frequency portion of the signal is passed by this filter section and will appear at the primary winding 22 of the transformer 24. Winding 22 is an inductance of sufficient impedance to act as a low band pass filter below 50 cycles per second. For frequencies above 50 cycles there is a high impedance and voltage across the primary winding 22 of coupling transformer 24.

The section of the input circuit consisting of the high band pass filter 16 is coupled by leads 26 and 28, respectively, to a modulation circuit 30. The voltage across filter 16 forms the input to the ring modulator circuit 30. The modulation circuit 30 consists of a diode bridge ring 32, formed by four current rectifying diodes 34 connected in series with each other and with load limiting resistors 36. Two opposite corners of the bridge ring 32 are connected to a secondary winding 38 of a coupling transformer 40. The opposite two corners of the bridge ring are connected to the primary winding 42 of another coupling transformer 44. The direct current-low frequency signal is connected by lead 26 to the midpoint of winding 38 and by lead 28 to the midpoint of winding 42.

An alternating current reference voltage is fed to the modulation circuit 30 from an oscillator circuit 46, shown as a transistorized multivibrator circuit. This oscillator circuit consists of cross-coupled transistors 48 and 50, respectively. The base 52 of transistor 48 is coupled through capacitor 54 to the collector electrode 56 of transistor 50. In a similar manner, base 58 of transistor 50 is coupled through capacitor 60 to the collector electrode 62 of transistor 48. The oscillator circuit 46 is somewhat conventional and operates in a manner such that transistors 48 and 50 become alternately conducting to produce an alternating current signal at terminal 64. The signal is fed into an amplifying transistor 66, whose output is coupled to the primary winding 68 of the coupling transformer 40. The output of oscillator 46 is a reference carrier signal having a frequency in the order of 1,000 cycles per second for example and is fed into the modulation circuit 30.

The low frequency input signal fed into the modulator 30 across leads 26 and 28 will modulate this carrier frequency, which, as modulated, will appear across the section of the primary winding 42 of transformer 44 from the lead 28 to the respective end of the winding in accordance with the conventional operation of ring modulators. This modulated reference carrier signal is picked up by the secondary winding 70 of coupling transformer 44 and is fed directly to a two-stage transistorized amplifier circuit 72. The input to amplifier 72, from winding 70, is coupled through capacitor 74 to the base electrode of a transistor 76, whose emitter electrode 78 is connected directly through a resistor 80 to the base electrode 82 of a second transistor 84 providing the second stage of amplification. The emitter electrode 86, of transistor 84, is connected to ground through a high band pass filter circuit 88, which cuts down the high frequency degeneration of the reference signal.

The output of amplifier 72 is connected to the primary winding 90 of a coupling transformer 92 whose secondary winding 94 provides an input portion of a ring demodulator circuit 96. The input winding 94 is, as shown, connected to opposite corners of a diode bridge 98 of the same type described and shown in the modulator section 30. The opposite corners of bridge 98 are connected across the secondary winding 100 of a coupling transformer 102, whose primary winding 104 is connected by lead 106 to the output of the oscillator circuit 46. This provides a reference signal input to the demodulator circuit 96, which is in phase with that fed to the modulator circuit 30.

The operation of the demodulator 96 is such as to cancel out the modulated carrier reference signal fed into the demodulator from the coupling transformer 92 and to invert portions of the low frequency signal previously inverted by the modulator 30. This results in an output signal across leads 108 and 110, which are respectively connected to the midpoints of the secondary windings 94 and 100. A filter trap 112 is connected in series with a terminal point 114 in the connecting lead 108. This filter trap 112 is tuned to the reference carrier frequency supplied by oscillator circuit 46 and thus blocks any of the carrier reference signal not removed by the demodulator to provide a maximum attenuation of this carrier frequency in the output of the demodulator 96.

The coupling transformer 24 includes a secondary winding 116 which comprises the input of a two-stage amplifier circuit 118, which is substantially identical in design and operation to the amplifier circuit 72. Transistors 120 and 122 provide the two stages of amplification of this circuit. The output of amplifier 122 is coupled through capacitor 124 to a second capacitor 126, which is used to block the low frequencies of the demodulator circuit 96 from the high frequency input terminal 128. In this manner, the amplified signals from amplifiers 72 and 118 are combined at terminal 114 connected to an output terminal 130. A second output terminal 132 is connected to ground. The output of the amplifying system, then, may be obtained across terminals 130 and 132.

The above described amplifier system is one in which the direct current-low frequency components of the signal are amplified by an alternating current amplifier. This is of an advantage in that it does not necessitate the use of a more complex and less controllable direct current type amplifier. The system furthermore provides one in which the input can be floating instead of being tied to ground or to a direct current source. This is an advantage as it does not necessitate the need of going through a transformer, which is normally required in floating arrangements.

The dividing of the input signal by utilizing a series network connecting the high and low band pass filters is one which minimizes phase and frequency distortion of the signal particularly within the critical overlapping region of the two filters. Since the high band pass filter 16 will block all frequencies up to 1,000 cycles and the low band pass filter, consisting of the primary winding 22, will block frequencies above 50 cycles, there results an overlapping range of frequencies between 50 c.p.s. to 1,000 c.p.s., which will produce alternating voltages across both high and low bandpass filter sections. This overlapping frequency range is relatively critical, since it is within this range that the cutoff frequency of the low pass filter 16 occurs. However, the series circuit arrangement of the input section 11 is one in which the voltage drop across the circuit remains constant irrespective of any changes or variations in function of the several circuit components. For example, if a shift in the operating characteristics of any one of the circuit components of the filter section 16 occurs, either instantaneously or over a period of time, to produce a voltage change across filter section 16 in one direction, there is a compensating shift of voltage in the opposite direction across the transformer winding 22. Thus, within this overlapping frequency range, if any signal is effected by a variation in operating characteristics of a circuit component, the voltage change for that frequency is automatically compensated for at the other filter section of the series circuit. This is provided by the series connection of the filter sections 16 and 22 in the input circuit.

During operation, it has been found that signal drift due to any of the well-known causes is distinctly minimized by this circuit because of this compensating characteristic. The input circuit portion 11, in accordance with the invention, provides a means in which the signal voltage in the overlapping range is kept constant irrespective of changes in circuit components of the filter sections, so that the two amplified portions of the signal, which appear as an added signal across terminals 130 and 132, will always be constant.

It is recognized that the low frequency signals below the cutoff point of filter 16 are not greatly affected by drift effects and, in a similar manner, the high frequency signals above the overlapping frequency range are little affected by drift effects of the low band pass filter.

An alternating current amplifier is used to amplify the direct current portions of the input signal. This eliminates use of a direct current amplifier, which is more critical to drift. In the modulator circuit 30 and the demodulator circuit 96, drift is minimized by careful balancing of all parts. It is also necessary, for optimum operation, to select transformers with balanced winding capacitances with respect to the core, i.e., with respect to ground. Also, for optimum results, it is necessary to use diodes in both circuits with matched forward-volt-ampere characteristics. The diodes 36 can be either thermionic or semiconductive.

The system, described above and as shown in the figure, is one which provides amplification of a wide band of frequencies with a minimum distortion of phase and frequency in the output signal. The system is also that in which distortion due to drift is extremely minimized in the overlapping frequency range of the high and low band pass filter of circuit 11. The circuit is that in which the input signals are split and then are combined without appreciable error. The system described is an off-ground broad band amplifier, which uses two parallel amplification channels to obtain precise reproduction of the high and low frequency signal portions. The system described provides a linearity variation of less than 1 percent between the input and output signal and a drift of less than 0.5 percent.

I claim:

1. An amplifier system for amplifying a band of signal frequencies, said system comprising an input circuit including a high pass filter circuit and a low pass filter means connected in series, said high pass filter circuit and said low pass filter means both including circuit components responsive to an intermediate band of signal frequencies between the low portion and the high portion of said signal frequency band, said high pass filter comprising a series connected capacitor and a resistor and capacitor connected in parallel, amplifier means coupled across said high pass filter circuit to amplify said intermediate band and said low frequency portion of said band of signal frequencies, said amplifier means including a modulation circuit providing an alternating current carrier signal to be modulated by said low frequency signal portion, an amplifier circuit coupled across said low pass filter means to amplify said intermediate band and said high frequency portion of said band of signal frequencies, and circuit means connected to the output of said amplifier means and said amplifier circuit to combine said amplified intermediate band and said high and low frequency portions into a composite signal output, said last circuit means including a demodulator circuit to provide an output consisting of an amplified low frequency signal portion.

2. An amplifier system for amplifying a band of signal frequencies, said system comprising an input circuit including a high pass filter circuit and a low pass filter means connected in series, said high pass filter circuit including a capacitance and a resistance in parallel and responsive to an intermediate band of signal frequencies between the low portion and the high portion of said signal frequency band, said low pass filter consisting of an inductance responsive to said intermediate band of signal frequencies, amplifier means coupled across said high pass filter circuit to amplify said intermediate band and said low frequency portion of said band of signal frequencies, said amplifier means including a modulation circuit providing a carrier signal modulated by said low and intermediate signal frequencies and a demodulator connected to said modulation circuit, an amplifier circuit coupled across said low pass filter means to amplify said intermediate band and said high frequency portion of said band of signal frequencies, and circuit means connected to the output of said amplifier means and said amplifier circuit to combine said amplified intermediate band and said high and low frequency portions into a composite signal output.

References Cited in the file of this patent

UNITED STATES PATENTS

| | | |
|---|---|---|
| 2,255,642 | Artzt | Sept. 9, 1941 |
| 2,727,141 | Cheek | Dec. 13, 1955 |
| 2,757,244 | Tomcik | July 31, 1956 |
| 2,781,423 | Kuczun | Feb. 12, 1957 |
| 2,794,866 | Dert | June 4, 1957 |

FOREIGN PATENTS

| | | |
|---|---|---|
| 459,723 | Great Britain | Jan. 13, 1937 |

OTHER REFERENCES

Article by Crowhurst: "More About Filters," Radio Electronics Magazine, May 1953, pages 62 and 63 relied upon.